United States Patent
Chen et al.

(10) Patent No.: US 11,736,121 B1
(45) Date of Patent: Aug. 22, 2023

(54) ERROR CORRECTION METHOD, ERROR CORRECTION CIRCUIT AND ELECTRONIC DEVICE APPLYING THE SAME

(71) Applicant: ETRON TECHNOLOGY, INC., Hsinchu (TW)

(72) Inventors: Ho-Yin Chen, Hsinchu (TW); Han-Hsien Wang, Hsinchu (TW); Han-Nung Yeh, Hsinchu (TW)

(73) Assignee: ETRON TECHNOLOGY, INC., Hsinchu (TW)

( * ) Notice: Subject to any disclaimer, the term of this patent is extended or adjusted under 35 U.S.C. 154(b) by 0 days.

(21) Appl. No.: 17/827,029

(22) Filed: May 27, 2022

(51) Int. Cl.
*H03M 13/09* (2006.01)
*H03M 13/00* (2006.01)
*H03M 13/11* (2006.01)

(52) U.S. Cl.
CPC ..... *H03M 13/098* (2013.01); *H03M 13/1108* (2013.01); *H03M 13/6597* (2013.01)

(58) Field of Classification Search
CPC ........... H03M 13/098; H03M 13/1108; H03M 13/6597
See application file for complete search history.

(56) References Cited

U.S. PATENT DOCUMENTS

2012/0144270 A1* 6/2012 Diggs ................ G06F 11/1068
  714/763
2016/0259575 A1* 9/2016 Hikimura ............ G06F 3/0653

* cited by examiner

*Primary Examiner* — Thien Nguyen
(74) *Attorney, Agent, or Firm* — Birch, Stewart, Kolasch & Birch, LLP

(57) ABSTRACT

An error correction method comprises: when a decoder determines that an input analog code is at a forbidden state, setting a digital binary code as a first predetermined code and inputting the digital binary code to an ECC engine; determining whether the digital binary code has no error or two errors; when the digital binary code has no error, outputting the digital binary code after ECC by the ECC engine; when the digital binary code has two errors, resetting the digital binary code as a second predetermined code and inputting the digital binary code to the ECC engine for ECC; and when the decoder determines that the input analog code is not at the forbidden state, decoding the input analog code into the digital binary code and inputting the digital binary code to the ECC engine for ECC.

12 Claims, 4 Drawing Sheets

|  | | S0 | S1 | S2 | S3 | S4 | S5 | S6 | S7 |
|---|---|---|---|---|---|---|---|---|---|
| 12 | <=> | 000 | 100 | 101 | 111 | 110 | 010 | 011 | 001 |
| 02 | <=> | 001 | 000 | 100 | 101 | 111 | 110 | 010 | 011 |
| 01 | <=> | 011 | 001 | 000 | 100 | 101 | 111 | 110 | 010 |
| 00 | <=> | 010 | 011 | 001 | 000 | 100 | 101 | 111 | 110 |
| 10 | <=> | 110 | 010 | 011 | 001 | 000 | 100 | 101 | 111 |
| 20 | <=> | 111 | 110 | 010 | 011 | 001 | 000 | 100 | 101 |
| 21 | <=> | 101 | 111 | 110 | 010 | 011 | 001 | 000 | 100 |
| 22 | <=> | 100 | 101 | 111 | 110 | 010 | 011 | 001 | 000 |

|      | S0' | S1' | S2' | S3' | S4' | S5' | S6' | S7' |
|------|-----|-----|-----|-----|-----|-----|-----|-----|
| 12 ⟷ | 001 | 000 | 100 | 101 | 111 | 110 | 010 | 011 |
| 02 ⟷ | 011 | 001 | 000 | 100 | 101 | 111 | 110 | 010 |
| 01 ⟷ | 010 | 011 | 001 | 000 | 100 | 101 | 111 | 110 |
| 00 ⟷ | 110 | 010 | 011 | 001 | 000 | 100 | 101 | 111 |
| 10 ⟷ | 111 | 110 | 010 | 011 | 001 | 000 | 100 | 101 |
| 20 ⟷ | 101 | 111 | 110 | 010 | 011 | 001 | 000 | 100 |
| 21 ⟷ | 100 | 101 | 111 | 110 | 010 | 011 | 001 | 000 |
| 22 ⟷ | 000 | 100 | 101 | 111 | 110 | 010 | 011 | 001 |

ERROR CORRECTION METHOD, ERROR CORRECTION CIRCUIT AND ELECTRONIC DEVICE APPLYING THE SAME

TECHNICAL FIELD

The disclosure relates in general to an error correction method, an error correction and an electronic device applying the same.

BACKGROUND

In order to enhance data transmission rate, many researches are developed. For example, in a PAM3 (Pulse-amplitude Modulation) interface, each bit transmitted on the PAM 3 interface has three states. In a new memory structure, each memory cell has three storage states.

For the memory structure or the PAM3 interface, one transfer error will induce more errors in the binary result. Thus, SECDED (single error correction double error detection) ECC (error code correction) is used for solving bit errors.

Thus, how to enhance error correction performance is important in data transmission and data receiving.

SUMMARY

According to one embodiment, an error correction method of an electronic device including a decoder and an error code correction (ECC) engine is provided. The error correction method comprises: determining by the decoder whether an input analog code is at a forbidden state, wherein each bit of the input analog code has at least three states; when the decoder determines that the input analog code is at the forbidden state, setting by the decoder a digital binary code as a first predetermined code and inputting the digital binary code to the ECC engine from the decoder; determining by the ECC engine whether the digital binary code from the decoder has no error or two errors; when the ECC engine determines that the digital binary code from the decoder has no error, outputting the digital binary code after ECC by the ECC engine; when the ECC engine determines that the digital binary code from the decoder has two errors, informing the decoder by the ECC engine, resetting by the decoder the digital binary code as a second predetermined code and inputting the digital binary code from the decoder to the ECC engine for ECC; and when the decoder determines that the input analog code is not at the forbidden state, decoding by the decoder the input analog code into the digital binary code and inputting the digital binary code from the decoder to the ECC engine for ECC.

According to another embodiment, an error correction circuit is provided. The error correction circuit includes: a decoder; and an error code correction (ECC) engine coupled to the decoder, wherein the decoder determines whether an input analog code is at a forbidden state, wherein each bit of the input analog code has at least three states; when the decoder determines that the input analog code is at the forbidden state, the decoder sets a digital binary code as a first predetermined code and inputs the digital binary code to the ECC engine from the decoder; the ECC engine determines whether the digital binary code from the decoder has no error or two errors; when the ECC engine determines that the digital binary code from the decoder has no error, the ECC engine outputs the digital binary code after ECC; when the ECC engine determines that the digital binary code from the decoder has two errors, the ECC engine informs the decoder, the decoder resets the digital binary code as a second predetermined code and the decoder inputs the digital binary code to the ECC engine for ECC; and when the decoder determines that the input analog code is not at the forbidden state, the decoder decodes the input analog code into the digital binary code and inputs the digital binary code to the ECC engine for ECC.

According to an alternative embodiment, an electronic device is provided. The electronic device includes: a signal source device; and a signal receiving device coupled to the signal source device, the signal receiving device including a decoder and an error code correction (ECC) engine coupled to the decoder, wherein the decoder determines whether an input analog code from the signal source device is at a forbidden state, wherein each bit of the input analog code has at least three states; when the decoder determines that the input analog code is at the forbidden state, the decoder sets a digital binary code as a first predetermined code and inputs the digital binary code to the ECC engine from the decoder; the ECC engine determines whether the digital binary code from the decoder has no error or two errors; when the ECC engine determines that the digital binary code from the decoder has no error, the ECC engine outputs the digital binary code after ECC; when the ECC engine determines that the digital binary code from the decoder has two errors, the ECC engine informs the decoder, the decoder resets the digital binary code as a second predetermined code and the decoder inputs the digital binary code to the ECC engine for ECC; and when the decoder determines that the input analog code is not at the forbidden state, the decoder decodes the input analog code into the digital binary code and inputs the digital binary code to the ECC engine for ECC.

BRIEF DESCRIPTION OF THE DRAWINGS

FIG. 2B shows a relationship between the input analog code and the digital binary code in another embodiment of the application.

FIG. 3 shows error conditions in one possible example.

Figures 1, 2A:
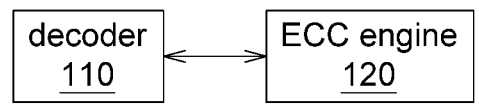
FIG. 1 shows a functional block diagram of an error correction circuit according to one embodiment of the application.
FIG. 2A shows a relationship between the input analog code and the digital binary code in one embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1 shows a functional block diagram of an error correction circuit according to one embodiment of the application. The error correction circuit 100 according to one embodiment of the application includes a decoder 110 and an error code correction (ECC) engine 120. The decoder 110 and the ECC engine 120 are coupled.

The decoder 110 is for decoding. For example but not limited by, the decoder 110 is for decoding an input analog code into a digital binary code. The input analog code has three states while the digital binary code has two states. In the following, the input analog code has three states 0, 1 and 2 while the digital binary code has two states 1 (logic 1) and 0 (logic 0). Further, for example but not limited by, the three states 0, 1 and 2 of the input analog code may be a low voltage level, an intermediate voltage level and a high voltage level. When an error occurs, the state 0 may become the state 1; the state 1 may become the state 0 or the state 2; and the state 2 may become the state 1.

FIG. 2A shows a first relationship between the input analog code and the digital binary code in one embodiment of the application. In one example, as for "S0" (which means "shift zero"), when the input analog code is "12", "02", "01", "00", "10", "20", "21" and "22", respectively, the digital binary code is "000", "001", "011", "010", "110", "111", "101" and "100", respectively. In one embodiment of the application, in order to reduce errors, the input analog code "11" is a forbidden state.

Still further, in FIG. 2A, "S1"~"S7" refer to "shift one" to "shift seven". "Shift one" means the digital binary code is shifted by one. For example, as for "S1 (shift one)", when the input analog code is "12", "02", "01", "00", "10", "20", "21" and "22", respectively, the digital binary code is "100", "000", "001", "011", "010", "110", "111" and "101", respectively. So are the "S2"~"S7".

FIG. 2B shows a second relationship between the input analog code and the digital binary code in another embodiment of the application. In one example, as for "S0" (which means "shift zero"), when the input analog code is "12", "02", "01", "00", "10", "20", "21" and "22", respectively, the digital binary code is "001", "011", "010", "110", "111", "101", "100" and "000", respectively. In one embodiment of the application, in order to reduce errors, the input analog code "11" is a forbidden state.

Still further, in FIG. 2B, "S1'"~"S7'" refer to "shift one" to "shift seven". For example, as for "S1' (shift one)", when the input analog code is "12", "02", "01", "00", "10", "20", "21" and "22", respectively, the digital binary code is "000", "001", "011", "010", "110", "111", "101" and "100", respectively. So are the "S2'"~"S7'".

The ECC engine 120 is for performing ECC operations. Structure of the ECC engine is not specified here.

During bit transmission, a transfer error may be occurred. One transfer error will induce more than one error in the binary result. FIG. 3 shows error conditions in one possible example. As shown in FIG. 3, in code receiving, the code source transmits "00", but the error correction circuit 100 may receive "01" or "10", which means there exists one error bit.

As shown in FIG. 3, in one embodiment of the application, as for S0~S7 and S0'~S7', in the sequence of the input analog code and the digital binary code, every state of the input analog code has two possible error states if the error happens at adjacent state. In details, as for the input analog code, when the input analog code has one bit error, then this error will result two possible error input analog codes. For example, when the input analog code "00" has one bit error, then this error will result two possible erroneous input analog codes "01" or "10", and so on.

Thus, in one embodiment of the application, considering that reception of the input analog code may have errors, the sequence of the digital binary code is helpful in error correction of the error correction circuit 100. For example, as described above, when the input analog code "00" has one bit error, then this error will result two possible erroneous input analog codes "01" or "10". The correct input analog code "00" is decoded into the digital binary code "010", and the two possible erroneous input analog codes "01" or "10" are decoded into the digital binary code "011" and "110", respectively. The digital binary codes "011" and "110" both have one bit error from the correct digital binary code "010", and the ECC engine 120 is capable of correcting one bit error. Thus, by arranging the sequence of the input analog code and the digital binary code, error correction of the error correction circuit 100 is enhanced.

Figure 4:
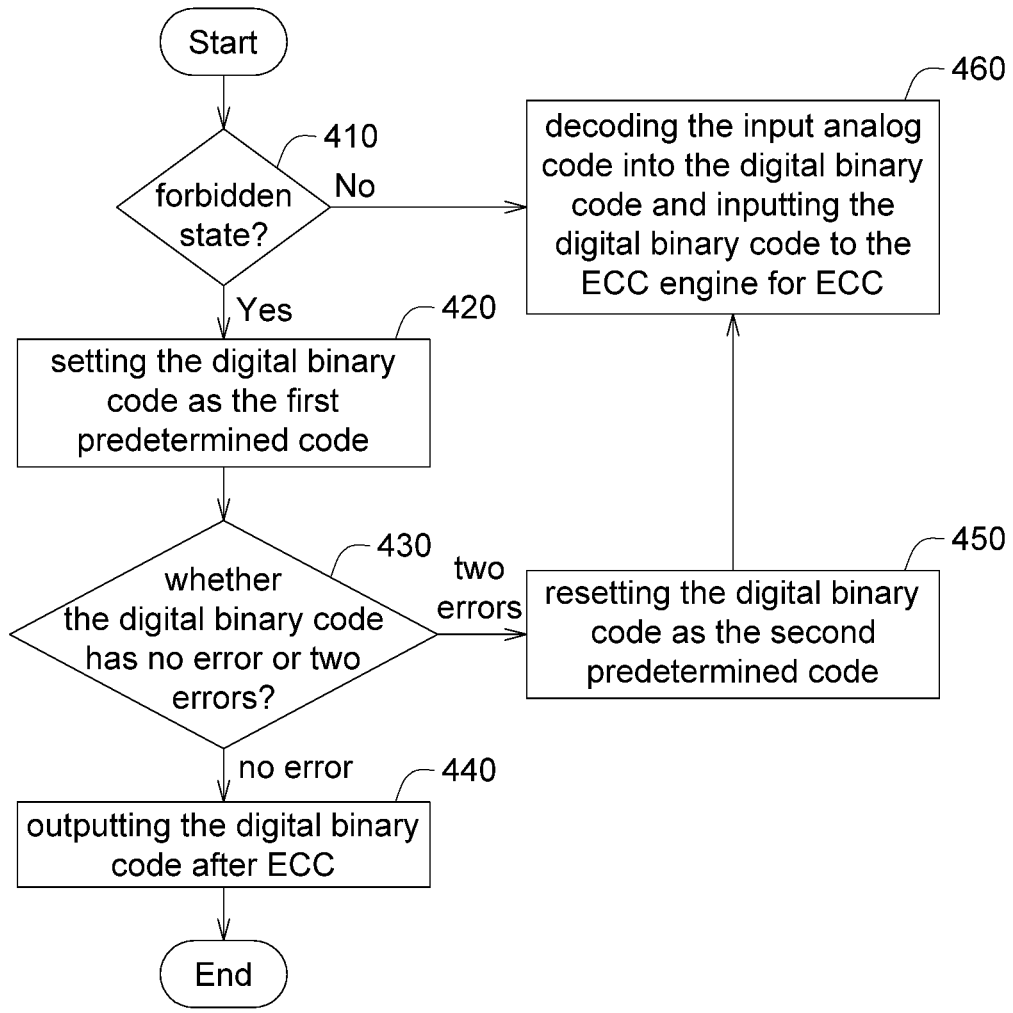
FIG. 4 shows an error correction method according to one embodiment of the application.

FIG. 4 shows an error correction method according to one embodiment of the application. In step 410, the decoder 110 determines whether the input analog code is at the forbidden state ("11"). If yes in step 410, the decoder 110 sets the digital binary code as the first predetermined code and sends the set digital binary code to the ECC engine 120 in step 420. If no in step 410, the decoder 110 decodes the input analog code into the digital binary code and sends the digital binary code to the ECC engine 120 in step 460.

In step 430, the ECC engine 120 determines whether the digital binary code from the decoder 110 has no error or two errors. When the ECC engine 120 determines the digital binary code from the decoder 110 has no error in step 430, the ECC engine 120 outputs the digital binary code after ECC in step 440. When the ECC engine 120 determines the digital binary code from the decoder 110 has two errors (which is beyond the error correction ability of the ECC engine 120) in step 430, the ECC engine 120 informs the decoder 110 and the decoder 110 resets the digital binary code as the second predetermined code in step 450.

In one embodiment of the application, the first predetermined code and the second predetermined code are as follows.

|  | first predetermined code | second predetermined code |
| --- | --- | --- |
| S0, S2, S4, S6 | "000" | "111" |
| S1, S3, S5, S7 | "111" | "000" |
| S0', S2', S4', S6' | "111" | "000" |
| S1', S3', S5', S7' | "000" | "111" |

In the above table, for example, when the relationship between the input analog code and the digital binary code is defined as "S0" in FIG. 2A, then the first predetermined code and the second predetermined code are set as "000" and "111", respectively; and so on.

Figure 5:
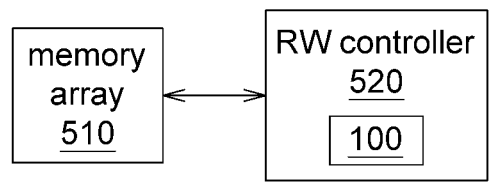
FIG. 5 shows a memory device according one embodiment of the application.

FIG. 5 shows a memory device according one embodiment of the application. As shown in FIG. 5, the memory device 500 according one embodiment of the application includes a memory array 510 and a read/write controller 520. The memory array 510 and the read/write controller 520 are coupled. The memory array 510 includes a plurality of memory cell and the memory cells have three storage states, i.e. state 0, state 1 and state 2. The memory array 510 may send the input analog code stored in the memory cells to the read/write controller 520. The read/write controller 520 includes the error correction circuit 100. By this structure, data transmission between the memory array 510 and the read/write controller 520 is improved. The memory array 510 and the read/write controller 520 are also referred as the signal source device and the signal receiving device respectively. The memory device is also referred as an electronic device.

Figure 6:
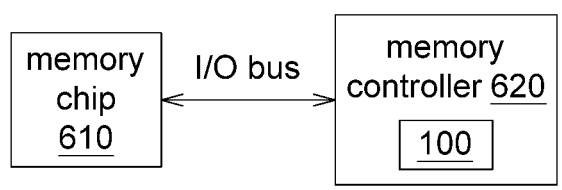
FIG. 6 shows an electronic device according one embodiment of the application.

FIG. 6 shows an electronic device according one embodiment of the application. As shown in FIG. 6, the electronic device 600 according one embodiment of the application includes a memory chip 610 and a memory controller 620. The memory chip 610 and the memory controller 620 are coupled. The memory controller 620 includes the error correction circuit 100. I/O bus between the memory chip 610 and the memory controller 620 may have at least one signal line and data on the signal line of the I/O bus has three data states, i.e. state 0, state 1and state 2. For example but not limited by, the I/O bus between the memory chip 610 and the memory controller 620 may be implemented by PAM3 (Pulse-amplitude Modulation) interface. By this structure, data transmission between the memory chip 610 and the memory controller 620 is improved. The memory chip 610 and the memory controller 620 are also referred as the signal source device and the signal receiving device respectively.

In one embodiment of the application, by the error correction method and the error correction circuit, error correction ability is enhanced.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An error correction method of an electronic device including a decoder and an error code correction (ECC) engine, the error correction method comprising:
   determining by the decoder whether an input analog code is at a forbidden state, wherein each bit of the input analog code has at least three states;
   when the decoder determines that the input analog code is at the forbidden state, setting by the decoder a digital binary code as a first predetermined code and inputting the digital binary code to the ECC engine from the decoder;
   determining by the ECC engine whether the digital binary code from the decoder has no error or two errors;
   when the ECC engine determines that the digital binary code from the decoder has no error, outputting the digital binary code after ECC by the ECC engine;
   when the ECC engine determines that the digital binary code from the decoder has two errors, informing the decoder by the ECC engine, resetting by the decoder the digital binary code as a second predetermined code and inputting the digital binary code from the decoder to the ECC engine for ECC; and
   when the decoder determines that the input analog code is not at the forbidden state, decoding by the decoder the input analog code into the digital binary code and inputting the digital binary code from the decoder to the ECC engine for ECC.

2. The error correction method according to claim 1, wherein the three states of each bit of the input analog code are state 0, state 1 and state 2, respectively.

3. The error correction method according to claim 1, wherein the forbidden state is "11".

4. The error correction method according to claim 1, wherein one of the first predetermined code and the second predetermined code is "111"; and the other one of the first predetermined code and the second predetermined code is "000".

5. An error correction circuit including:
   a decoder; and
   an error code correction (ECC) engine coupled to the decoder,
   wherein
   the decoder determines whether an input analog code is at a forbidden state, wherein each bit of the input analog code has at least three states;
   when the decoder determines that the input analog code is at the forbidden state, the decoder sets a digital binary code as a first predetermined code and inputs the digital binary code to the ECC engine from the decoder;
   the ECC engine determines whether the digital binary code from the decoder has no error or two errors;
   when the ECC engine determines that the digital binary code from the decoder has no error, the ECC engine outputs the digital binary code after ECC;
   when the ECC engine determines that the digital binary code from the decoder has two errors, the ECC engine informs the decoder, the decoder resets the digital binary code as a second predetermined code and the decoder inputs the digital binary code to the ECC engine for ECC; and
   when the decoder determines that the input analog code is not at the forbidden state, the decoder decodes the input analog code into the digital binary code and inputs the digital binary code to the ECC engine for ECC.

6. The error correction circuit according to claim 5, wherein the three states of each bit of the input analog code are state 0, state 1 and state 2, respectively.

7. The error correction circuit according to claim 5, wherein the forbidden state is "11".

8. The error correction circuit according to claim 5, wherein one of the first predetermined code and the second predetermined code is "111"; and the other one of the first predetermined code and the second predetermined code is "000".

9. An electronic device including:
   a signal source device; and
   a signal receiving device coupled to the signal source device, the signal receiving device including a decoder and an error code correction (ECC) engine coupled to the decoder,
   wherein
   the decoder determines whether an input analog code from the signal source device is at a forbidden state, wherein each bit of the input analog code has at least three states;
   when the decoder determines that the input analog code is at the forbidden state, the decoder sets a digital binary code as a first predetermined code and inputs the digital binary code to the ECC engine from the decoder;
   the ECC engine determines whether the digital binary code from the decoder has no error or two errors;
   when the ECC engine determines that the digital binary code from the decoder has no error, the ECC engine outputs the digital binary code after ECC;

when the ECC engine determines that the digital binary code from the decoder has two errors, the ECC engine informs the decoder, the decoder resets the digital binary code as a second predetermined code and the decoder inputs the digital binary code to the ECC engine for ECC; and when the decoder determines that the input analog code is not at the forbidden state, the decoder decodes the input analog code into the digital binary code and inputs the digital binary code to the ECC engine for ECC.

10. The electronic device according to claim 9, wherein the three states of each bit of the input analog code are state 0, state 1 and state 2, respectively.

11. The electronic device according to claim 9, wherein the forbidden state is "11".

12. The electronic device according to claim 9, wherein one of the first predetermined code and the second predetermined code is "111"; and the other one of the first predetermined code and the second predetermined code is "000".

\* \* \* \* \*